United States Patent [19]
Brox

[11] Patent Number: 5,847,986
[45] Date of Patent: Dec. 8, 1998

[54] MEMORY ARRAY WITH REDUCED CHARGING CURRENT

[75] Inventor: Martin Brox, Munich, Germany

[73] Assignee: Siemens Aktiengesellschaft, Munich, Germany

[21] Appl. No.: 992,379

[22] Filed: Dec. 17, 1997

[51] Int. Cl.$^6$ ........................................................ G11C 5/06
[52] U.S. Cl. ................................................ 365/63; 365/51
[58] Field of Search .......................................... 365/63, 51

[56] References Cited

U.S. PATENT DOCUMENTS 4,975,874  12/1990  Childers et al. ............................ 365/63
5,214,600   5/1993  Otto et al. .................................. 365/51

Primary Examiner—David Nelms
Assistant Examiner—Andrew Q. Tran
Attorney, Agent, or Firm—Stanton C. Braden

[57] ABSTRACT

The spacing of the bit lines and/or the master bit lines (MBLs) of a memory array is skewed to decrease the charging current required to precharge the bit-lines and or the master bit lines. In one embodiment of the invention, an integrated circuit (IC) includes an array of memory cells arranged in rows and columns, with a pair of bit lines (BLTi and BLCi) per column of memory cells with BLTi carrying the cell data and BLCi its complement. The bit lines are disposed within a first level of the IC and run generally parallel to each other wherein there is a certain capacitance, CINT, between each two paired bit lines (BLTi and BLCi) and a capacitance, CEXT, between the bit lines of adjacent columns. The bit lines are coupled to selected MBLs with the MBLs being paired so that one MBL of a pair (MBLT) carries bit line data and the other MBL of a pair (MBLC) carries the complement of that bit line data. The MBLs are formed on a second level of the IC and run generally parallel to each other wherein there is a capacitance (MCINT) between the two paired master bit lines and a capacitance (MCEXT) between the master bit lines of a pair and the adjacent master bit lines. The spacing between the bit lines is skewed in order to decrease CINT relative to CEXT, and/or the spacing between the MBLs is skewed in order to decrease MCINT relative to MCEXT.

13 Claims, 7 Drawing Sheets

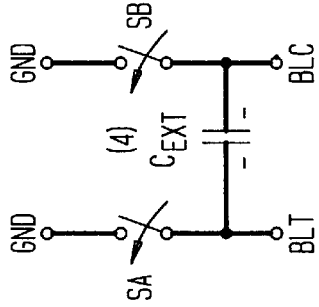
FIG. 3B
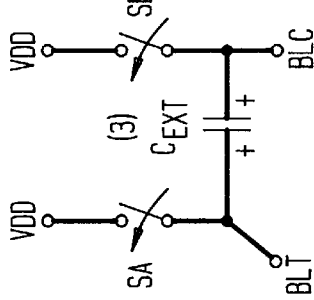
FIG. 4D
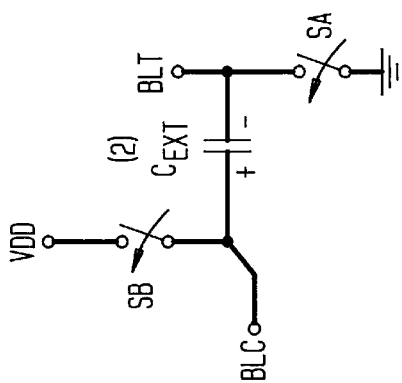
FIG. 4C
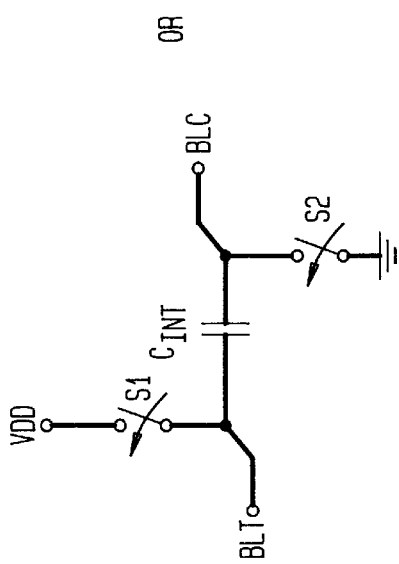
FIG. 3A
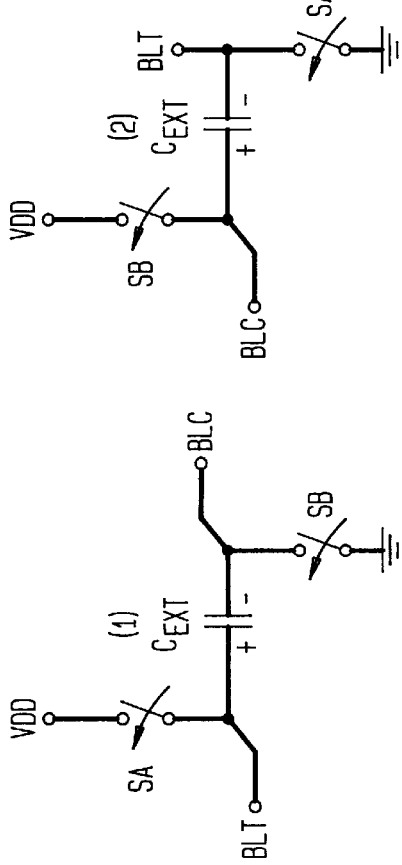
FIG. 4B
FIG. 4A

MEMORY ARRAY WITH REDUCED CHARGING CURRENT

BACKGROUND OF THE INVENTION

This invention relates to memory arrays and, in particular, to modifying the layout of memory arrays for reducing the charging currents of the arrays.

It is very important to reduce and/or minimize the power dissipated by a memory array. A significant source of power dissipation results from the requirement to charge the bit lines of the array during each sense cycle. The problem is aggravated in the design of high density memories whose bit lines are placed very close to each other.

FIG. 1 shows a portion of an array of memory cells 20 arranged in rows and columns. Array 20 includes a word line (WLi) per row and a "true" column conductor (BLTi) per column and a memory cell 21 connected at the intersection of each word line and bit line conductor, BLT. The array includes a section 30 for producing a complementary signal on a "complementary" bit line denoted as BLCi corresponding to each BLTi whereby each column includes a "true" bit-line (BLT) and a paired "complement" bit-line (BLC). The true and complement information is then fed to a sense amplifier (SA) associated with that column.

In known memory arrays, the bit lines are laid out so as to be equidistant from each other. That is, each BLTi is the same distance from its paired BLCi as it is from the BLC(i−1) of the adjacent column, as illustrated in FIG. 2.

To better explain a feature of the invention to follow, note that the capacitance $C_{INT}$ between a pair of bit-lines (BLTi and BLCi) associated with the column Ci is generally equal to the capacitance ($C_{EXT}$) between the bit lines of adjacent columns [BLTi and BLC(i−1)].

Note also, as shown in FIG. 2A, that before each read or write cycle the memory array and all the bit lines are precharged to a voltage (e.g., VDD/2) which, for example, may be selected to be equal to one-half the operating voltage (VDD and ground) applied to the memory array.

During each read cycle, the bit lines of the memory are driven to a high or low condition, with BLCi always driven to be the complement of BLTi. After the completion of the read-out, the bit-lines are again driven to VDD/2, as noted above, and as shown in FIG. 2A.

It is an object of this invention to reduce the power dissipation in the memory due to the precharging and discharging of the bit lines of a memory array.

SUMMARY OF THE INVENTION

As noted above, in systems embodying the invention, there exists a certain amount of capacitance ($C_{INT}$) between the two bit lines (defining a pair of bit lines) of a column and there exists a certain amount of capacitance ($C_{EXT}$) between the bit lines of adjacent columns. Applicant's invention resides, in part, in the recognition that more charge current is required to charge and discharge the capacitance ($C_{INT}$) existing between the paired bit lines of a column than the capacitance ($C_{EXT}$) existing between the bit lines of adjacent columns.

Applicant's invention also resides in modifying the layout of the bit lines of the array whereby the capacitance ($C_{INT}$) of the paired bit lines is decreased even if this causes an increase in the capacitance ($C_{EXT}$) between adjacent bit lines. By decreasing the paired bit line capacitance ($C_{INT}$) which requires higher (more) charging currents, relative to the capacitance ($C_{EXT}$) between adjacent bit lines, less overall current is required and the power dissipation is decreased.

BRIEF DESCRIPTION OF THE DRAWINGS

In the accompanying drawings, like reference characters denote like components.

FIGS. 3A and 3B are simplified diagrams showing two possible conditions of the internal capacitance ($C_{INT}$) and the corresponding paired bit lines;

FIGS. 4A, 4B, 4C and 4D are simplified diagrams showing four (4) possible conditions of the external capacitance ($C_{EXT}$) and the corresponding conditions of the bit lines of adjacent columns;

DETAILED DESCRIPTION OF THE INVENTION

The invention may be best understood by noting the following:

a) Between each pair of bit lines of a column (i.e., BLTi and BLCi) there is a capacitance $C_{INT}$.

b) Between adjacent bit lines from different columns [i.e., BLC(i−1) and BLTi; or BLCi and BLT(i+1)] there is a capacitance $C_{EXT}$.

c) Before any read/sense cycle, a precharge signal is applied to all the bit lines (BLTi and BLCi) of the array. The precharge signal may be assumed to set all the bit lines to VDD/2 volts where (as before) VDD and ground are assumed to be the operating potential applied to the memory array.

d) Following precharge, assume that the contents of the elements of a row of the memory array are read out onto their respective bit lines. Each cell of the row contains a "high" or a "low". Consequently, each BLTi line will be high or low and its corresponding BLCi line will be at a complementary level condition. Each and every $C_{INT}$ of the array will have one if its two plates charged to VDD and the other plate at ground, as shown in FIGS. 3A and 3B.

However, BLTi and BLC(i−1) or BLCi and BLT(i+1) can move in the opposite direction or they can move in the same direction. The voltages developed across the capacitances $C_{EXT}$ between the bit lines of adjacent columns can then be as shown in FIGS. 4A and 4B or they can be as shown in FIGS. 4C and 4D. Statistically it may be assumed that the conditions of FIGS. 4A and 4B occur 50% of the time and the conditions of FIGS. 4C and 4D occur 50% of the time.

e) To establish the conditions of FIGS. 3A and 3B the total charge (QA) to be supplied to $C_{INT}$ is equal to $(C_{INT})$ (VDD). To establish the conditions of FIGS. 4A, 4B, 4C and 4D the total charge (QB) to be supplied to $C_{EXT}$ may be expressed as ½$(C_{EXT})$ (VDD). (Since on a statistical basis only one half of the intercolumn capacitance $C_{EXT}$ are charged to VDD during a read out cycle.)

Figure 1:
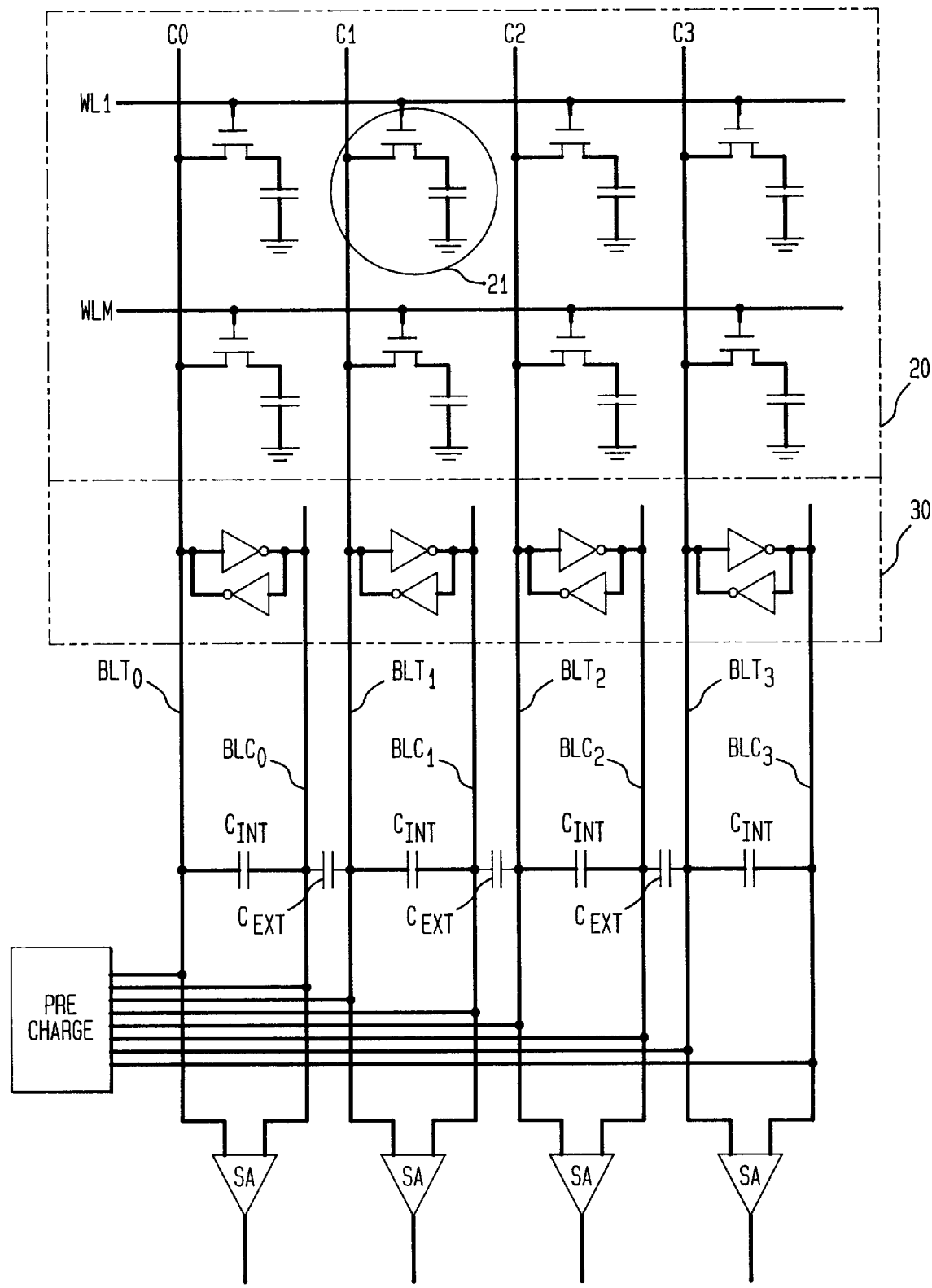
FIG. 1 is a semi-schematic, semi-block diagram of a prior art memory system.
Figure 2:
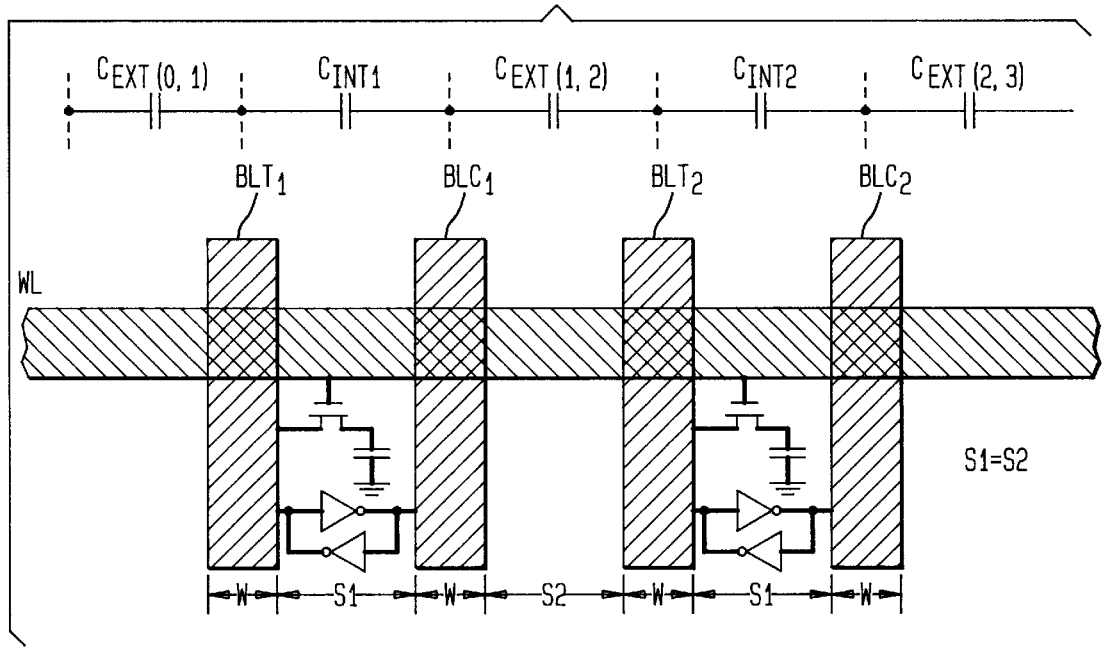
FIG. 2 is a simplified top view diagram (not to scale) of the layout of a portion of the bit lines of a prior art memory array.
Figure 2A:
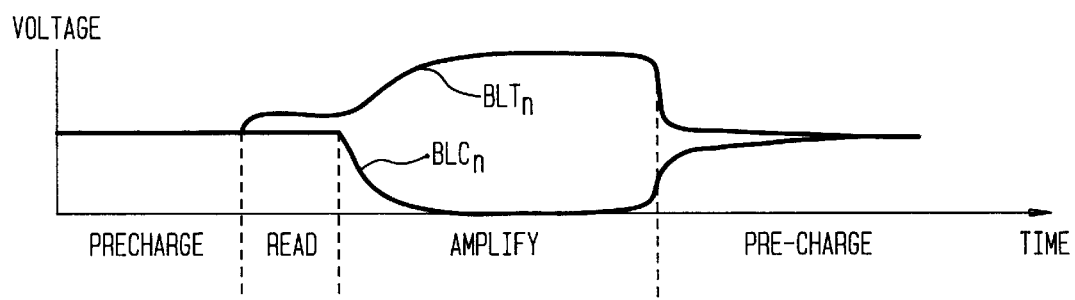
FIG. 2A illustrates the precharging of the bit lines of the memory arrays of FIGS. 1 and 2 before and after each read/write cycle.

The total charge (and corresponding charging current) may be expressed as follows:

$$Q=(C_{INT})(VDD)+½(C_{EXT})(VDD) \qquad \text{Eq. 1}$$

f) The prior art teaches that the layout of the bit lines be such that they are spaced equidistant from each other as shown in FIG. 2; that is, the spacing between the bit lines is S1=S2. Therefore, each $C_{INT}$ is generally equal to each $C_{EXT}$.

g) However, based on the analysis set forth in paragraph (e) above, applicant recognized that by decreasing $C_{INT}$ (even at the cost of increasing $C_{EXT}$) the charging current and the total charge consumed by the system is decreased.

h) An analysis of certain conditions that exist and to be met are as follows:

(1)—The capacitance (C) between bit lines may be generally expressed as:

$$C=K/S \qquad \text{Eq. 2}$$

where

K=a constant; and

S=the distance between the bit lines.

Figure 5:
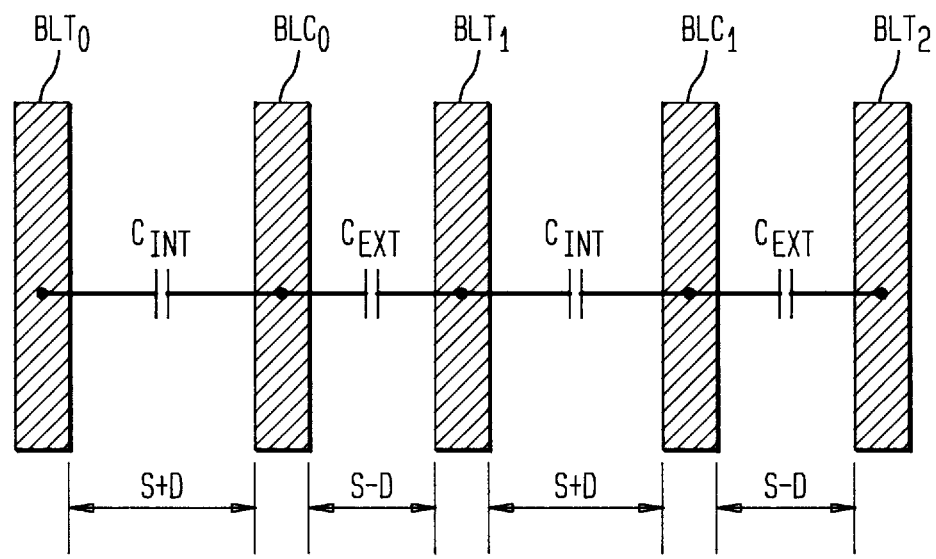
FIG. 5 illustrates the skewing of the spacing between the bit line in accordance with the invention.

(2)—Assume as shown in FIG. 5 that the distance between the bit lines of a column (BLTi and BLCi) is increased by an amount D (in order to decrease $C_{INT}$) and that the distance between the bit lines of adjacent columns is decreased by an amount D (increasing $C_{EXT}$).

Hence, $C_{INT}$ may be expressed as follows:

$$C_{INT}=K/(S+D) \qquad \text{Eq. 3}$$

and $$C_{EXT}=K/(S-D) \qquad \text{Eq. 4}$$

(3)—Substituting equations 3 and 4 into equation 1 yields:

$$Q_{(D)}=VDD\{[K/(S+D)]+½[K/(S-D)]\} \qquad \text{Eq. 5}$$

Taking the derivative of $Q_{(D)}$, dQ/dD=0, yields

D/S=0.172

Figure 6:
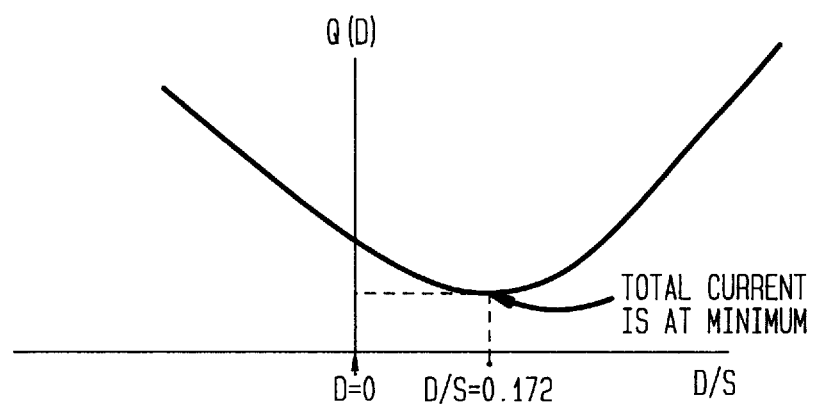
FIG. 6 is a sketch showing the variation in charge current as a function of different bit line spacings.

A sketch of $Q_{(D)}$ as a function of D/S is shown in FIG. 6. As derived in Eq. 5, the minimum charging current is obtained for a ratio of D/S equal to 0.172. Thus, optimally, the spacing (S1) between the paired bit lines of a column should be S1=S+0.172 while the spacing (S2) between the bit lines of the adjacent columns should be S2=S−0.172. Therefore, skewing the spacing between the bit lines, in accordance with the invention, will reduce the total charging current. Thus, in a very dense array, charge current and power dissipation is decreased by increasing the spacing between the paired bit lines (BLTi and BLCi) and decreasing the spacing between the bit lines of adjacent columns [BLC(i−1) and BLTi; or BLCi and BLT(i+1)].

Figure 7A:
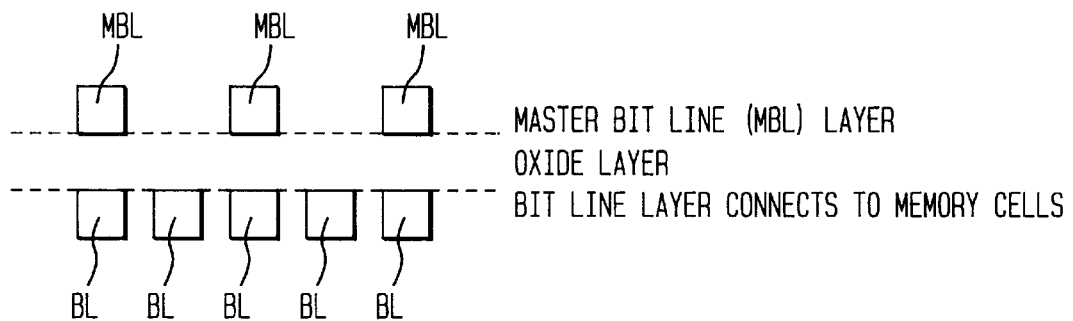
FIGS. 7A, 7B and 7C show, respectively, a cross-section of an IC illustrating the formation of bit lines and master bit lines on different levels; the layout and interconnection of bit-lines (BLs) and master bit-line (MBLs); and the pairing of master bit lines and their connection to sense amplifiers.
Figure 7B:
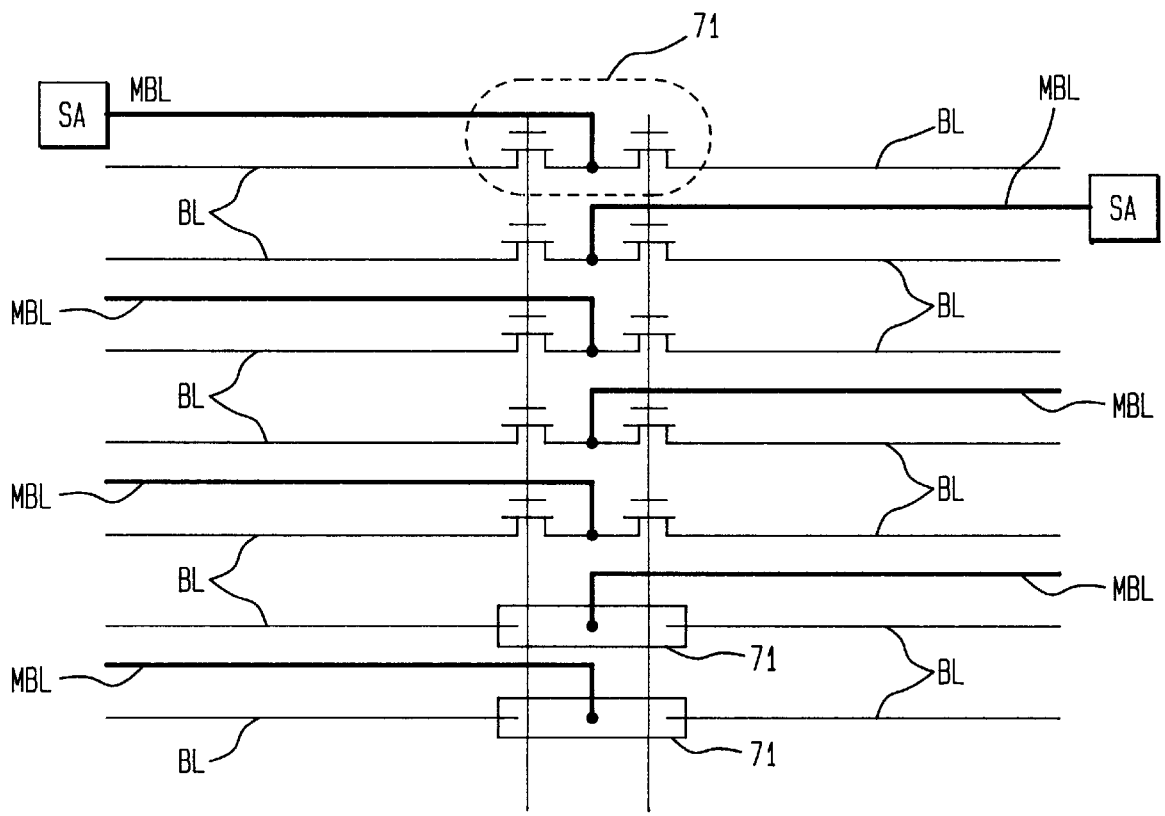
Figure 7C:
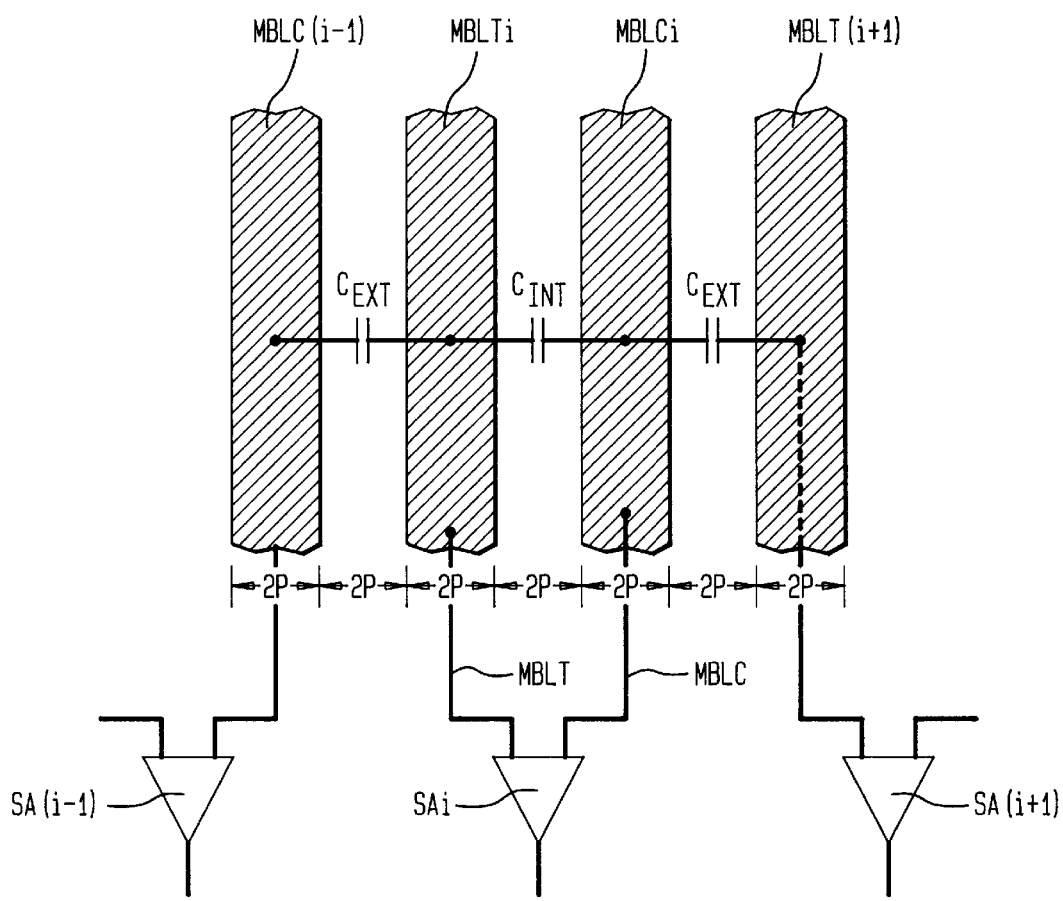

An example of the application of the general calculations described above is as follows. A hierarchical bit-line architecture (as shown in FIG. 7A) permits double-pitch (2P) layout of the master bit lines coupling the outputs of the bit lines to sense amplifiers as shown in FIGS. 7B and 7C. Bit-lines (BL) on a particular level may be coupled via switches 71 to a master bit-line (MBL) on a higher level as shown in FIGS. 7A and 7B. As shown in FIG. 7C, each sense amplifier has a master bit-line (MBLT) for carrying data and a complementary bit-line (MBLC) for carrying the complementary data coupled to its outputs. The capacitance between paired master bit-lines (MBLTi and MBLCi) is defined as CINT and the capacitance between the master bit-lines of adjacent columns is defined as CEXT. For the layout of FIG. 7, CINT is equal to CEXT, with each one of CINT and CEXT being equal to K/2P, where K is a technology dependent constant. Also, as discussed above the charge (Q) needed to charge up these capacitances is as expressed in equation 1, above.

Figure 8:
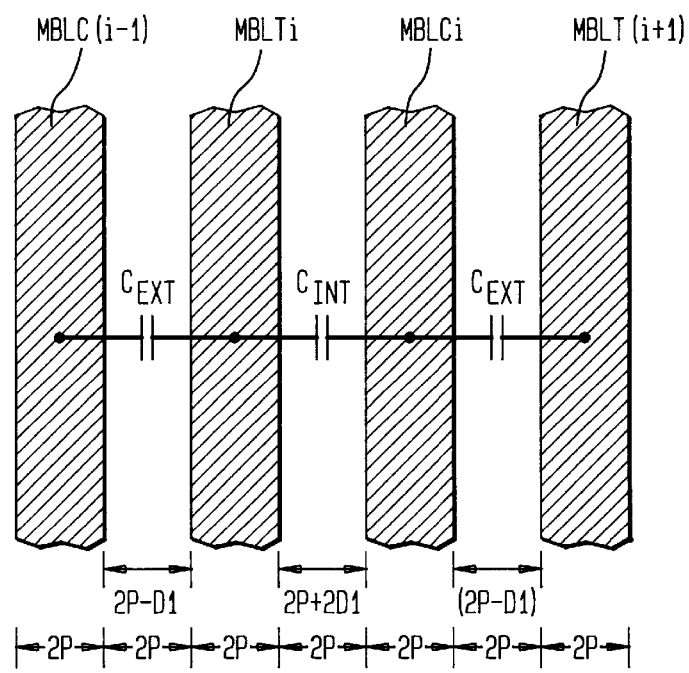
FIG. 8 is a layout of the master bit-lines of a FIG. 7 type architecture, in accordance with the invention.

In accordance with the invention, the total charge required to charge the internal capacitances, CINT, (and hence the charging current for the bit lines) is decreased by moving the paired bit-lines (i.e., MBLTi and MBLCi) feeding the same sense amplifier (SAi) further apart while decreasing the spacing between the bit lines of adjacent columns, as shown in FIG. 8. A calculation for optimizing the lay out shown in FIGS. 7A, 7B and 7C to produce the one shown in FIG. 8 is as follows:

$$Q(D)=VDD\{[K/(2P+D)]+(½)[K/(2P+C)]\} \text{Minimizing with respect to } D, \ dQ/dD=0 \text{ yields} \qquad \text{Eq. 6}$$

$$D=0.34 \ P \qquad \text{Eq. 7}$$

From the point of lithography, the spacing requirement is increased slightly (1.66 P versus 2 P for the minimum space). However, the spacing requirement is still not critical; critical levels would arise for requirements to use single pitch (1 P), or less.

FIG. 8 illustrates the skewing of the master bit lines. However, it should be evident that skewing of both the bit lines and the master bit lines can be done.

Figure 8A:
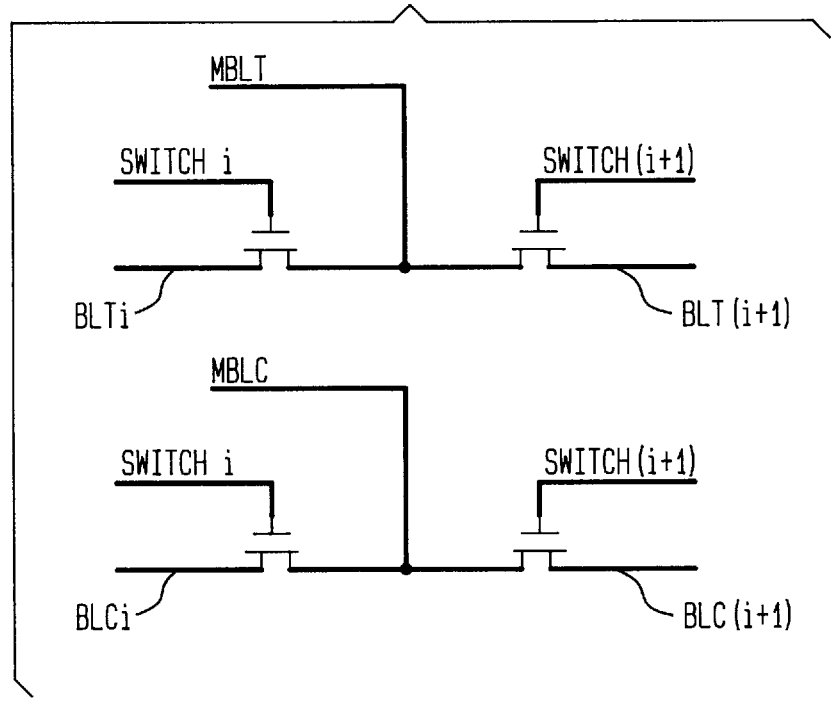
FIGS. 8A and 8B are, respectively, a schematic diagram showing the interconnection of bit lines to respective master bit lines; and a schematic diagram showing the layout of master bit lines, in accordance with the invention.

The master bit lines are preferably formed on a master bit line (MBL) layer formed on top of a bit line (BL) layer containing the bit lines, similar to the showing in FIG. 7A. Thus, the bit lines and the master bit lines run in the same direction, though formed on different levels. One or more BLT lines may be coupled to an MBLT line and one or more BLC lines may be coupled to an MBLC line, as shown in FIG. 8A. That is, each master bit line (MBL) carries the data of two or more bit lines (BLs). In order to facilitate switching between selected BLs and a corresponding MBL, a simple multiplex transistor may be inserted between the bit lines and the corresponding MBL, as shown in FIG. 8A. The selection of which BL gets connected to an MBL is accomplished by simple address decoding.

Figure 8B:
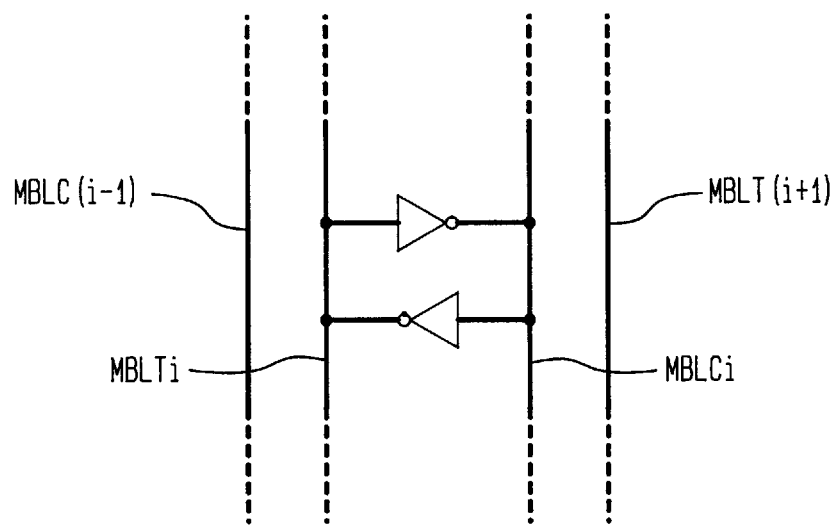

In layouts embodying the invention, the BLT and BLC lines are formed on a first level of a semiconductor chip with the $BLC_i$s being defined by connecting inverters between the $BLT_i$s and the corresponding $BLC_i$s. The BLTs may be connected to respective MBLTs on a second level and the BLCs may be connected to respective MBLCs, also on the second level. The MBLCs may be defined from the underlying BLC and/or by the connection of inverters between corresponding MBLTs and MBLCs, as shown in FIG. 8B.

Therefore, in accordance with the invention, the spacing between bit-lines and/or master bit-lines can be controlled (increased and/or decreased) to reduce the charging currents required to (pre) charge the bit-lines and/or the master bit-lines.

What is claimed is:

1. In an integrated circuit (IC) including an array of memory cells arranged in rows and columns and including a pair of bit lines per column of memory cells, the pair of bit lines per column for carrying the data of a cell and its complement, and wherein the bit lines are disposed along a level of the IC, wherein there is a capacitance, CINT, between paired bit-lines and a capacitance, CEXT, between each one of the bit-lines of a pair and the bit lines of adjacent columns, the improvement comprising:

spacing the bit lines so that the spacing between the paired bit lines is greater than the spacing between the bit lines of each pair and the bit lines of adjacent columns.

2. In an IC as claimed in claim 1 wherein the bit lines are spaced such that the capacitance, CINT, between the paired bit lines is less than the capacitance, CEXT, between the paired bit lines of a column and the adjacent bit lines of adjacent columns.

3. In an IC as claimed in claim 2 wherein the bit lines are precharged before each read cycle and wherein less current is required to charge the bit lines for the condition where CINT is less than CEXT, than for the condition where CEXT is equal to or greater than CINT.

4. In an IC as claimed in claim 1, wherein the bit-lines are master bit-lines.

5. In an IC as claimed in claim 1, wherein the bit-lines are directly connected to the memory cells of the array.

6. In an IC as claimed in claim 5, wherein the bit-lines are disposed on a first level of the IC, and wherein the IC includes a second level, and wherein master bit-lines are disposed on said second level and the master bit-lines are connected via switch means to the bit-lines of the first level, and wherein the master bit-lines are paired, each pair of master bit-lines for carrying the data of a cell and its complement; and wherein the spacing between each paired master bit-line is greater than the spacing between the paired master bit-lines and adjacent master bit-lines.

7. In an integrated circuit (IC) including an array of memory cells arranged in rows and columns and including a pair of bit lines per column of memory cells, the pair of bit lines per column for carrying the data of a cell and its complement, and wherein the bit lines are disposed along a level of the IC, wherein there is a capacitance, CINT, between paired bit-lines and a capacitance, CEXT, between each one of the bit-lines of a pair and the bit lines of adjacent columns, the improvement comprising:

spacing the bit lines such that the capacitance, CINT, between the paired bit lines is less than the capacitance, CEXT, between the paired bit lines of a column and the adjacent bit lines of adjacent columns.

8. In an IC as claimed in claim 7 wherein the bit lines are precharged before each read cycle and wherein less current is required to charge the bit lines for the condition where CINT is less than CEXT, than for the condition where CEXT is equal to or greater than CINT.

9. In an IC as claimed in claim 7 wherein the bit lines are master bit-lines which are coupled to the memory cells of the array via subsidiary bit-lines.

10. In an integrated circuit (IC) including an array of memory cells arranged in rows and columns and including a pair of bit-lines per column of memory cells, the pair of bit-lines per column for carrying the data of a cell and its complement, and wherein the bit-lines are disposed along a level of the IC, wherein there is a capacitance, CINT, between each two paired bit-lines and a capacitance, CEXT, between the bit-lines of adjacent columns, and wherein the bit-lines are precharged before each read operation of the memory cells, the improvement comprising:

means for decreasing the charging current needed to charge the bit lines of the array including spacing the bit lines so that the spacing between the paired bit lines is greater than the spacing between the bit lines of each pair and the bit lines of adjacent columns.

11. In an IC as claimed in claim 10 wherein the bit lines are spaced such that the capacitance, CINT, between the paired bit lines is less than the capacitance, CEXT, between the paired bit lines of a column and the adjacent bit lines of adjacent columns.

12. In an integrated circuit (IC) including an array of memory cells arranged in rows and columns and including a pair of bit-lines per column of memory cells disposed within a first level of the IC, with one bit-line of a pair for carrying the data contained in the memory cells of its associated column, and the other bit-line of a pair for carrying the complement of that data, and including master bit-lines (MBL) disposed within a second level of the IC with the master bit-lines being coupled to a predetermined number of bit-lines, and the master bit-lines being arranged in pairs with one MBL of a pair for carrying the data of one or more bit lines and the other MBL of a pair for carrying the complement of that data, and wherein there is a capacitance, MCINT, between paired master bit-lines and a capacitance, MCEXT, between the master bit-lines of a pair of master bit lines and the adjacent master bit-lines, the improvement comprising:

spacing the master bit lines so that the capacitance, MCINT, between paired master bit-lines is less than the capacitance, MCEXT, between paired master bit-lines and the adjacent master bit-lines.

13. In an IC as claimed in claim 12 wherein the master bit-lines are precharged before each read cycle and wherein less current is required to charge the master bit-lines for the condition where MCINT is less than MCEXT, than for the condition where MCEXT is equal to or greater than MCINT.

* * * * *